(12) United States Patent
Chung

(10) Patent No.: US 7,846,795 B2
(45) Date of Patent: Dec. 7, 2010

(54) BIT LINE OF A SEMICONDUCTOR DEVICE AND METHOD FOR FABRICATING THE SAME

(75) Inventor: Jie Won Chung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 345 days.

(21) Appl. No.: 12/141,859

(22) Filed: Jun. 18, 2008

(65) Prior Publication Data

US 2008/0286926 A1  Nov. 20, 2008

Related U.S. Application Data

(62) Division of application No. 11/291,016, filed on Nov. 29, 2005, now abandoned.

(30) Foreign Application Priority Data

Jun. 22, 2005  (KR) .............................. 2005-53919

(51) Int. Cl.
*H01L 21/336* (2006.01)

(52) U.S. Cl. .................. 438/262; 438/238; 438/240; 438/254; 438/255; 438/303; 257/E21.269; 257/E21.275

(58) Field of Classification Search .................. None
See application file for complete search history.

(56) References Cited

U.S. PATENT DOCUMENTS

| 6,022,776 | A | 2/2000 | Lien et al. |
| 6,114,767 | A | 9/2000 | Nagai et al. |
| 6,261,891 | B1 * | 7/2001 | Cheng et al. ................. 438/238 |
| 6,331,495 | B1 | 12/2001 | Becker |
| 6,380,042 | B1 | 4/2002 | Huang |
| 6,630,739 | B1 | 10/2003 | Sonego et al. |
| 6,700,143 | B2 | 3/2004 | Tuan et al. |
| 6,972,223 | B2 | 12/2005 | Weimer et al. |
| 2001/0009810 | A1 | 7/2001 | Li et al. |
| 2002/0047151 | A1 | 4/2002 | Kim et al. |
| 2002/0105088 | A1 | 8/2002 | Yang et al. |
| 2003/0203113 | A1 | 10/2003 | Cho et al. |
| 2005/0196114 | A1 | 9/2005 | Xu et al. |

FOREIGN PATENT DOCUMENTS

| KR | 10-2000-0074692 A | 12/2000 |
| KR | 10-2004-0028244 A | 4/2004 |

* cited by examiner

*Primary Examiner*—N Drew Richards
*Assistant Examiner*—Kyoung Lee
(74) *Attorney, Agent, or Firm*—Townsend and Townsend and Crew LLP

(57) ABSTRACT

A bit line of a semiconductor device includes a first interlayer dielectric film disposed on a semiconductor substrate, a plurality of bit line stacks disposed on the first interlayer dielectric film, a plurality of bit line spacers disposed on side walls of the bit line stacks, and a buffer film disposed on the bit line spacers, the first interlayer dielectric film and the bit line stacks; and a method for fabricating the same.

8 Claims, 2 Drawing Sheets

BIT LINE OF A SEMICONDUCTOR DEVICE AND METHOD FOR FABRICATING THE SAME

BACKGROUND OF THE INVENTION

1. Field of the Invention

The present invention relates to a method for fabricating a semiconductor device, and more particularly to a method for fabricating a bit line of a semiconductor device.

2. Description of the Related Art

Generally, in memory cells of semiconductor devices, a bit line is known as a signal-transmission passage between components constituting unit memory devices which can store 1-bit unit data.

FIG. 1 illustrates a bit line formed by a method for fabricating a bit line of a semiconductor device in accordance with conventional methods.

Referring to FIG. 1, in fabricating the bit line of a semiconductor device, a first interlayer dielectric film 110 is formed on a semiconductor substrate 100 having gates (not shown) and landing plugs (not shown) formed thereon. Next, a portion of the first interlayer dielectric film 110 is etched such that the upper parts of the landing plugs are exposed, thereby forming a bit line contact hole (not shown). A barrier metal film (not shown) is formed inside the bit line contact hole. Next, a conductive material (not shown) is formed such that the bit line contact hole is embedded, thereby forming a bit line contact (not shown). Next, a bit line-forming material (not shown), e.g., tungsten and nitride material, is deposited on the bit line contact and first interlayer dielectric film 110.

The bit line-forming material is then etched to overlap with the bit line contact, thereby forming bit line stacks 120 in which, for example, tungsten 125 and a hard mask nitride film 127 are sequentially stacked. Next, bit line spacers 130 are formed on the sidewalls of the bit line stacks 120. The bit line spacers 130 may be formed from a nitride film, which has high tensile stress. Then, an oxide film (not shown), which is a second interlayer dielectric film, is formed on the first interlayer dielectric film 110, via a high density plasma (HDP) process, such that the gap between the bit line stacks 120 is embedded. The oxide film, formed by the high density plasma (HDP) process, has compression stress.

The bit line of the semiconductor device in accordance with conventional methods suffer from collapse of the bit line stacks 120 due to different properties between the bit line spacer 130 and the oxide film in the course of embedding the oxide film, as the second interlayer dielectric film, during a high density plasma (HDP) process. Bit line spacers 130 exhibit high tensile stress, while the oxide film, as the second interlayer dielectric film, exhibits compression stress. The different types of stress results in a collapse of the bit line stacks 120, as represented by 'A' in FIG. 1.

Such stress-induced collapse of the bit line stacks 120 becomes more severe as the semiconductor device is highly integrated. For example, a conventional 80 nm-sized semiconductor device can resist stress with the second interlayer dielectric film by securing a final critical dimension of about 70 nm of the bit line stacks 120. As the dimensions of semiconductor devices have recently been reduced to 65 nm due to high degree of integration thereof, a final critical dimension of the bit line stacks is sharply decreased to 30 nm. Consequently, capability of the bit line stacks to withstand stress with the second interlayer dielectric film is lowered, thereby resulting in a collapse thereof, which in turn leads to a short-circuit with adjacent bit line stacks, thus deteriorating characteristics of the devices. As such, it is difficult to fabricate high-reliability devices.

SUMMARY OF THE INVENTION

Embodiments of the present invention alleviate stress between the bit line stack and the second interlayer dielectric film for insulating bit line stacks.

In accordance with an aspect of the present invention, a bit line of a semiconductor device comprises a first interlayer dielectric film disposed on a semiconductor substrate; a plurality of bit line stacks disposed on the first interlayer dielectric film; bit line spacers disposed on side walls of the bit line stacks; and a buffer film disposed on the bit line spacers, the first interlayer dielectric film, and the bit line stacks. The bit line stacks may be made of a tungsten film and a hard mask nitride film sequentially stacked. The bit line spacers may be made of a nitride film.

In accordance with another aspect of the present invention, a method for fabricating a bit line of a semiconductor device comprises forming bit line stacks on a first interlayer dielectric film formed on a semiconductor substrate; forming bit line spacers on side walls of the bit line stacks; forming a buffer film on the first interlayer dielectric film and the bit line stacks; annealing the buffer film to lower tensile stress thereof; and forming a second interlayer dielectric film on an entire surface of the resulting structure having the buffer film formed thereon. The bit line stack-forming material may be made of a tungsten film and a hard mask nitride film sequentially stacked. The bit line spacers may be formed of a nitride film. The buffer film may be formed of an oxide film, via atomic layer deposition (ALD) utilizing pyridine as a catalyst.

In one embodiment of the present invention, annealing can be carried out at a temperature of about 650° C. to 700° C. for about 120 seconds under nitrogen atmosphere.

BRIEF DESCRIPTION OF THE DRAWINGS

Embodiments of the present invention will be more clearly understood from the following detailed description taken in conjunction with the accompanying drawings, in which.

DESCRIPTION OF THE EMBODIMENTS

Figure 1:
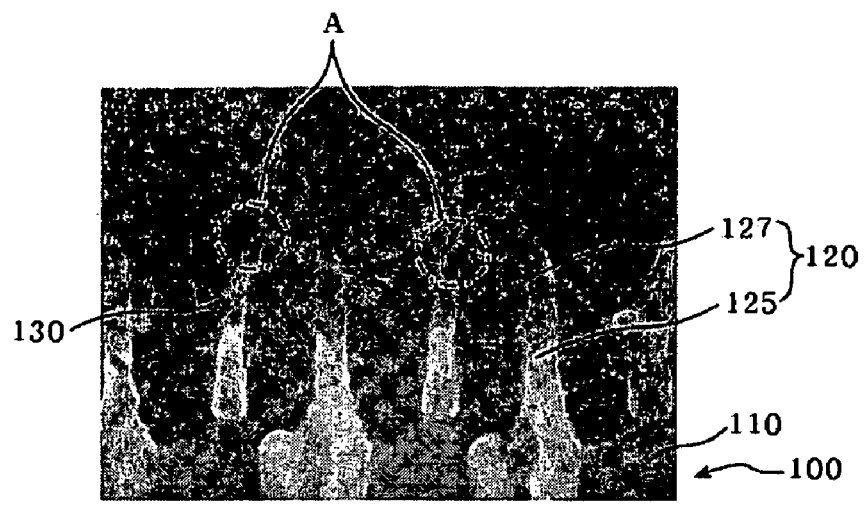
FIG. 1 illustrates a bit line formed by a method for fabricating a bit line of a semiconductor device in accordance with conventional methods.

Embodiments of the present invention will be described in more detail with reference to accompanying drawings, such that those skilled in the art can easily practice the present invention. In the drawings, thicknesses of various layers and regions are exaggerated for clarity. Like numbers refer to like elements throughout the specification and drawings.

Figure 2:
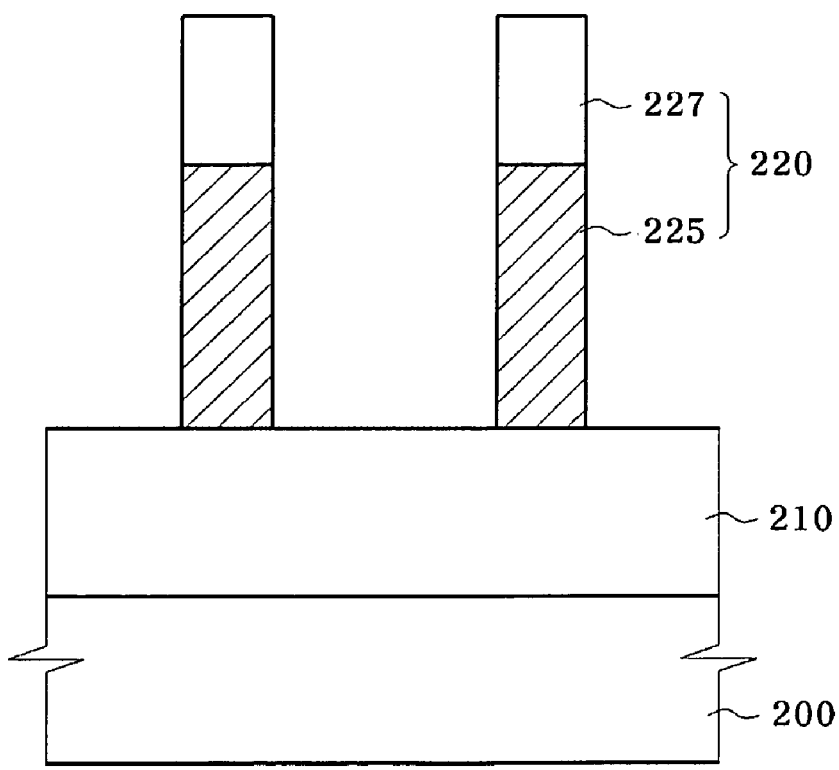
FIGS. 2 through 4 are cross-sectional views illustrating bit line of a semiconductor device in accordance with an embodiment of the present invention.
Figure 3:
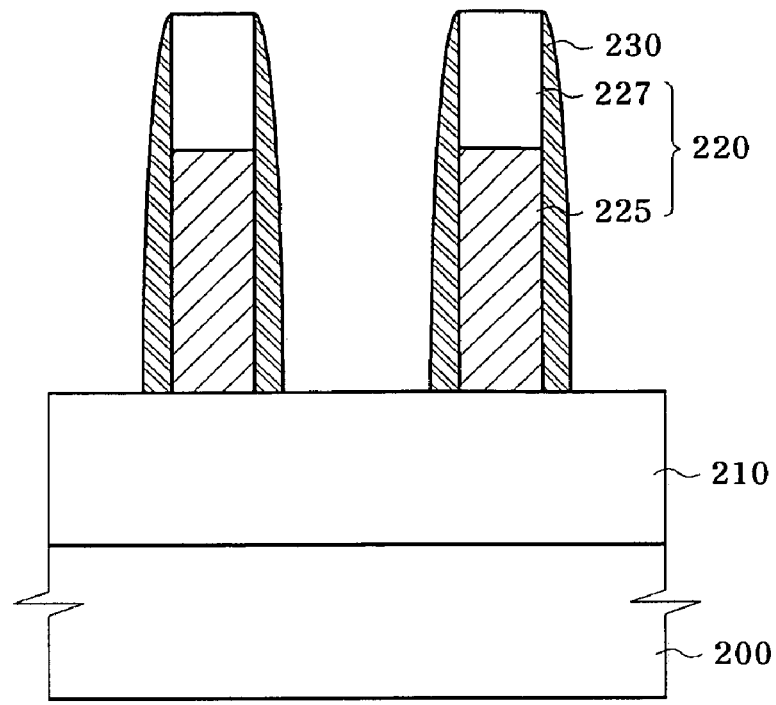
Figure 4:
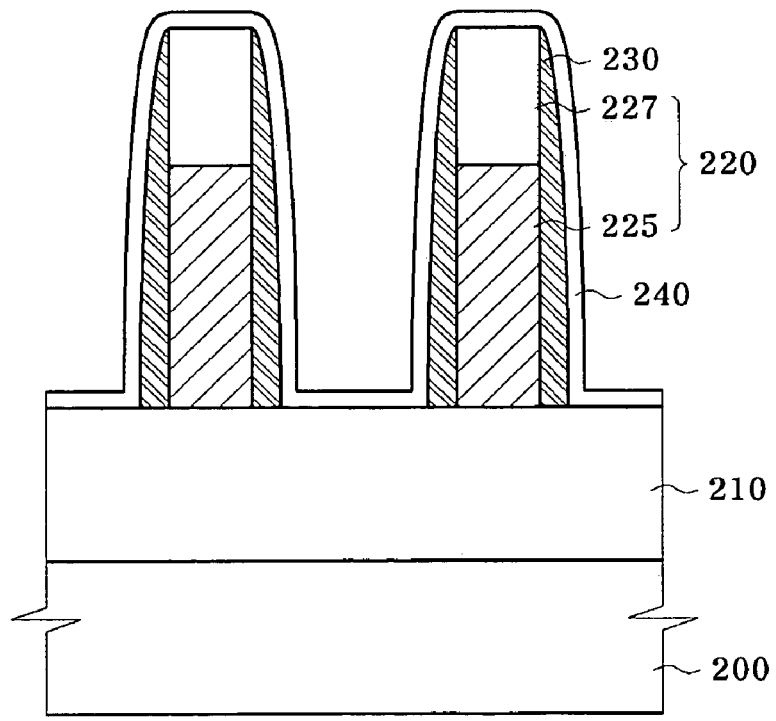

FIGS. 2 through 4 are cross-sectional views illustrating a bit line of a semiconductor device in accordance with an embodiment of the present invention.

FIG. 4 is a cross-sectional view showing the structure of bit line of a semiconductor device in accordance with an embodiment of the present invention. Referring to FIG. 4, a first interlayer dielectric film 210 is disposed on a semiconductor substrate 200 and a plurality of bit line stacks 220 are disposed on the first interlayer dielectric film 210. A plurality of bit line stacks 220 may have a structure in which a tungsten film 225 and a hard mask nitride film 227 are sequentially stacked. Bit line spacers 230 are disposed on side walls of the bit line stacks 220. Bit line spacers 230 are made from nitride films. A buffer film 240 is disposed on bit line spacers 230, first interlayer dielectric film 210, and bit line stacks 220. The buffer film 240 is made from an oxide film.

In such a structure, the buffer film 240 serves to alleviate stress between the bit line spacers 230 and a second interlayer dielectric film (not shown) which will be formed on the buffer film 240 via a subsequent process, preventing a collapse of the bit line stacks 220 due to such stress.

Hereinafter, a method for fabricating the bit line of a semiconductor device in accordance with an embodiment the present invention will be described with reference to FIGS. 2 through 4.

First, referring to FIG. 2, a bit line-forming material (not shown) is deposited on the first interlayer dielectric film 210, which was formed on the semiconductor substrate 200. The bit line-forming material is composed of a tungsten film 225 and a hard mask nitride film 227 sequentially stacked. Next, the bit line-forming material is selectively etched to form bit line stacks 220 composed of the tungsten film 225 and hard mask nitride film 227 sequentially stacked.

Although not shown in FIG. 2, gates (not shown) and landing plugs (not shown) are formed on the semiconductor substrate 200, and a bit line contact (not shown) providing electrical connection between the bit line stacks 220 and landing plug is formed on the landing plugs. In addition, in dynamic random access memory (DRAM) devices, source/drain impurity regions (not shown) are formed inside the semiconductor substrate 200.

Next, referring to FIG. 3, a bit line spacer-forming material (not shown) is deposited on the first interlayer dielectric film 210 such that the bit line stacks 220 are embedded, followed by an etching process such as a blank etching process, thereby forming bit line spacers 230 on side walls of the bit line stacks 220. The bit line spacers 230 can be deposited to a thickness of about 130 Å, using a nitride film. In one embodiment of the present invention, bit line spacers 230 exhibit tensile stress of about $1.3 \times 10^{10}$ dyne/cm$^2$. Such bit line spacers 230 are used as barrier films, upon forming a subsequent self aligned contact.

Next, referring to FIG. 4, a buffer film 240 is formed on the entire surface of the resulting structure having the bit line spacers 230 formed thereon. Methods of forming the buffer film may be formed via use of atomic layer deposition (ALD) utilizing pyridine ($C_5H_5N$) as a catalyst.

More specifically, hexachlorodisilane ($Si_2Cl_6$) may be used as a source gas. The source gas is supplied and adsorbed and a purging gas is supplied to purge the remaining non-adsorbed source gas. Next, water vapor ($H_2O$), as a reactant gas, is supplied to initiate a reaction between the absorbed hexachlorodisilane source gas and the reactant gas, thereby forming a buffer oxide film as an atomic layer unit. Next, the purging gas is supplied to purge by-products of the reactant gas which did not participate in the reaction. In one embodiment of the present invention, such atomic layer deposition of the buffer oxide film is carried out at a deposition temperature of about 100 to 105° C. As such, a process cycle may comprise first supplying a hexachlorodisilane source gas and purging, then supplying a reactant gas and purging, and repeating this process to form the buffer film 240 to a desired thickness. In one embodiment of the present invention, the buffer film 240, formed via one cycle of the process, has a thickness of about 1.0 to 1.5 Å.

After formation of the buffer film 240 via atomic layer deposition, annealing is carried out at a temperature of about 650 to 700° C. under nitrogen ($N_2$) atmosphere for about 100 to 120 seconds. As a result, the resulting buffer film 240 may have a tensile stress of about $3 \times 10^9$ dyne/cm$^2$.

Upon forming the buffer film via atomic layer deposition, followed by annealing, as described above, the buffer film 240 has a relatively low tensile stress as compared to the bit line spacers 230. Therefore, it is possible to alleviate stress between the buffer film 240 and an oxide film which will be formed via a subsequent high density plasma (HDP) process, namely a second interlayer dielectric film. Although not shown in FIG. 4, the oxide film, as the second interlayer dielectric film, is formed on the entire surface of the resulting structure having the buffer film 240 formed thereon, via the high density plasma process.

As apparent from the above description, via application of a method for fabricating a bit line of a semiconductor device in accordance with the present invention, a buffer film having low tensile stress is formed between the bit line spacers, which are formed for use as a barrier film of a self aligned contact, and the second interlayer dielectric film. As a result, it is possible to prevent collapse of the bit line stacks due to different stress between the bit line spacers and second interlayer dielectric film.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a conductive line of a semiconductor device, comprising:
   forming conductive line stacks on a first interlayer dielectric film formed on a semiconductor substrate;
   forming spacers on side walls of the conductive line stacks;
   forming a buffer film on the first interlayer dielectric film and conductive line stacks;
   annealing the buffer film to lower its tensile stress than that of the spacers; and
   forming a second interlayer dielectric film on the buffer film
   wherein the buffer layer alleviates stress induced by the second inter layer dielectric film.

2. The method according to claim 1, wherein the conductive line stacks are bit line stacks.

3. The method according to claim 1, wherein the spacers include a nitride film.

4. The method according to claim 1, wherein the buffer film includes an oxide film formed via an atomic layer deposition (ALD) process utilizing pyridine as a catalyst.

5. The method according to claim 1, wherein the annealing is carried out at a temperature of about 650° C. to 700° C. for about 120 seconds under nitrogen atmosphere.

6. The method according to claim 2, wherein the bit line stacks includes a tungsten film and a hard mask nitride film sequentially stacked.

7. The method according to claim 1, wherein the spacers and the buffer film are made of different materials.

8. The method according to claim 1, wherein the buffer film includes an oxide film formed via an atomic layer deposition (ALD) process using hexa chlorodisilane source gas.

* * * * *